United States Patent
Wheeler

(10) Patent No.: US 11,762,367 B2
(45) Date of Patent: Sep. 19, 2023

(54) BENCHTOP VISUAL PROTOTYPING AND ASSEMBLY SYSTEM

(71) Applicant: Rockwell Collins, Inc., Cedar Rapids, IA (US)

(72) Inventor: Ryan Wheeler, Anamosa, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 209 days.

(21) Appl. No.: 17/314,367

(22) Filed: May 7, 2021

(65) Prior Publication Data

US 2022/0357717 A1    Nov. 10, 2022

(51) Int. Cl.
*G06F 9/451* (2018.01)
*G05B 19/4097* (2006.01)

(52) U.S. Cl.
CPC ......... *G05B 19/4097* (2013.01); *G06F 9/451* (2018.02); *G05B 2219/32128* (2013.01)

(58) Field of Classification Search
CPC ...... G05B 19/4097; G05B 2219/32128; G06F 9/451; G06F 30/20
See application file for complete search history.

(56) References Cited

U.S. PATENT DOCUMENTS

| 10,109,111 B2 | 10/2018 | Sterzbach |
| 10,732,915 B2 | 8/2020 | Shibao et al. |
| 2017/0316610 A1* | 11/2017 | Lin ..................... G02B 27/017 |
| 2018/0277015 A1* | 9/2018 | Casella .................... G09B 7/02 |
| 2018/0304392 A1 | 10/2018 | Daniel et al. |
| 2019/0189307 A1 | 6/2019 | Mehrotra et al. |
| 2019/0236507 A1 | 8/2019 | Bauer et al. |

FOREIGN PATENT DOCUMENTS

| DE | 10205605 A1 | 8/2003 |
| EP | 2052807 B1 | 12/2010 |
| EP | 2578353 B1 | 4/2019 |
| KR | 20170002921 A * | 1/2017 ............. G06Q 10/10 |
| WO | 2019151877 A1 | 8/2019 |
| WO | 2019201487 A1 | 10/2019 |

* cited by examiner

*Primary Examiner* — Thomas C Lee
*Assistant Examiner* — Tyler Dean Hedrick
(74) *Attorney, Agent, or Firm* — Suiter Swantz pc llo

(57) ABSTRACT

A visual prototyping and assembly system includes a work surface configured to hold one or more work-in-progress units during an assembly operation. The visual prototyping and assembly system may receive the one or more images of the work-in-progress units; determine a current assembly state of the work-in-progress units based on the one or more images of the work-in-progress units; generate a current digital twin model of the -in-progress units corresponding to the current assembly state of the work-in-progress units and display the current digital twin model a user interface; determine a subsequent assembly state of the work-in-progress units; and generate a subsequent digital twin model of the work-in-progress units corresponding to the subsequent assembly state of the work-in-progress units and display the subsequent digital twin model on the user interface.

7 Claims, 4 Drawing Sheets

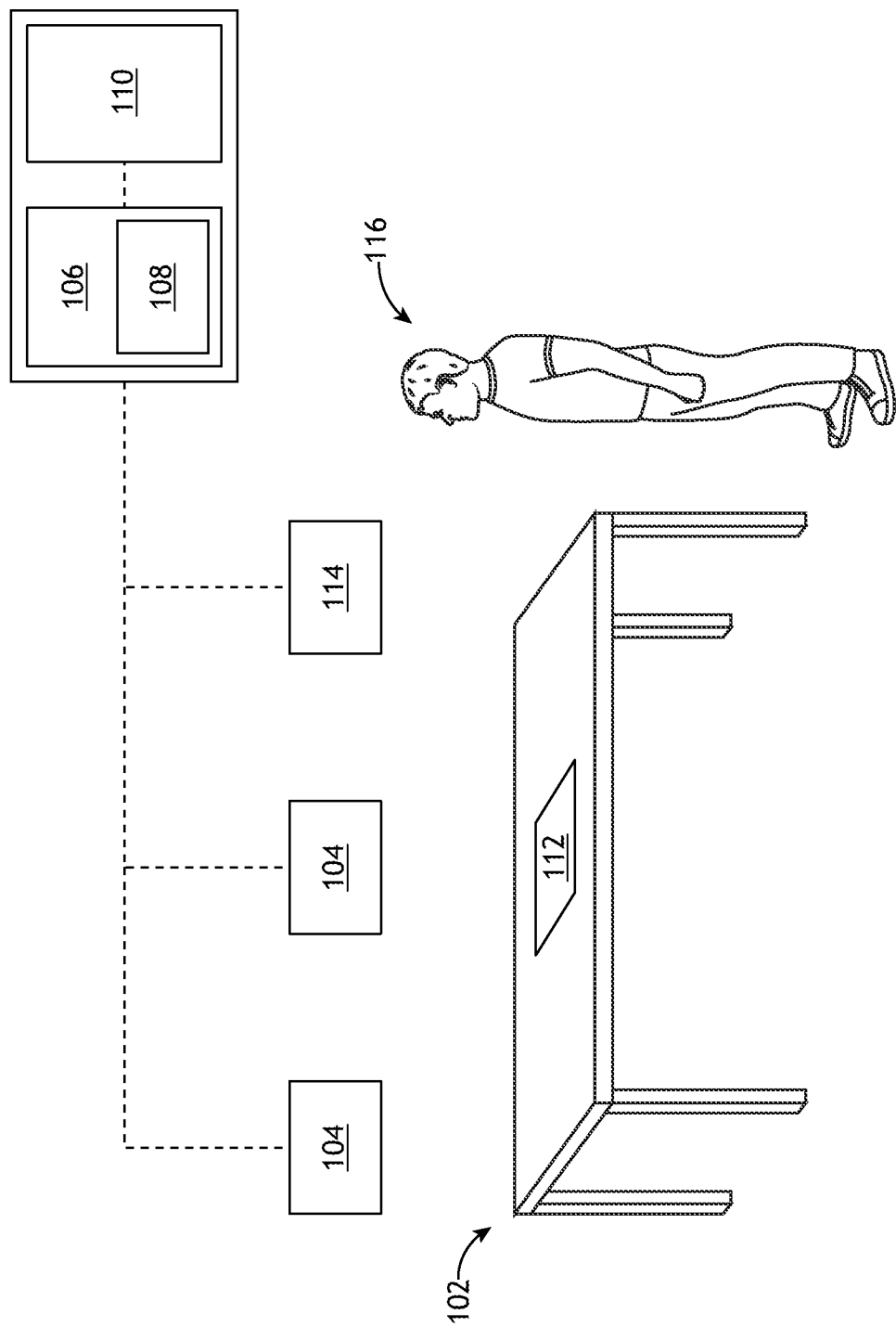

BENCHTOP VISUAL PROTOTYPING AND ASSEMBLY SYSTEM

BACKGROUND

Maintenance and assembly of aircraft components (e.g., avionics systems) is often complex, with several steps, and tedious. Additionally, the complexity of aircraft components and the numerosity of the pieces, parts, and elements thereof render maintenance and assembly difficult without clear and specific instructions. Current methods of maintenance and assembly require a user to read written instructions delineating the steps of the maintenance and/or assembly processes. Other methods utilize augmented reality hardware to animate maintenance and assembly operations in a virtual form, which allows a user to watch the operations in a virtual environment prior to performing the operations in a real-world setting. Previously proposed augmented reality methods often require the use of cumbersome hardware worn by an operator, such as head-mounted displays. Such hardware is often inhibitive of an operator's movement and ability to complete the maintenance and assembly operations. Consequently, there is a need for solutions that provide virtual animations of maintenance and assembly operations without the use of cumbersome hardware.

SUMMARY

A visual prototyping and assembly system is disclosed, in accordance with one or more embodiments of the present disclosure. In one embodiment, the visual prototyping and assembly system includes a work surface configured to hold one or more work-in-progress units during an assembly operation. In another embodiment, the visual prototyping and assembly system includes one or more vision subsystems configured to capture one or more images of the one or more work-in-progress units. In another embodiment, the visual prototyping and assembly system includes one or more controllers comprising one or more processors, wherein the one or more processors are configured to execute a set of program instructions stored in one or more memory units communicatively coupled to the one or more processors, wherein the set of program instructions is configured to cause the one or more controllers to: receive the one or more images of the one or more work-in-progress units; determine a current assembly state of the one or more work-in-progress units based on the one or more images of the one or more work-in-progress units; generate a current digital twin model of the one or more work-in-progress units corresponding to the current assembly state of the one or more work-in-progress units and display the current digital twin model on one or more user interfaces; determine a subsequent assembly state of the one or more work-in-progress units; and generate a subsequent digital twin model of the one or more work-in-progress units corresponding to the subsequent assembly state of the one or more work-in-progress units and display the subsequent digital twin model on the one or more user interfaces.

A method of visually modeling an assembly operation is disclosed, in accordance with one or more embodiments of the present disclosure. In one embodiment, the method includes receiving one or more images of one or more work-in-progress units. In another embodiment, the method includes determining a current assembly state of the one or more work-in-progress units based on the one or more images of the one or more work-in-progress units. In another embodiment, the method includes generating a current digital twin model of the one or more work-in-progress units corresponding to the current assembly state of the one or more work-in-progress units and displaying the current digital twin model on one or more user interfaces. In another embodiment, the method includes determining a subsequent assembly state of the one or more work-in-progress units. In another embodiment, the method includes generating a subsequent digital twin model of the one or more work-in-progress units corresponding to the subsequent assembly state of the one or more work-in-progress units and displaying the subsequent digital twin model on the one or more user interfaces.

BRIEF DESCRIPTION OF THE DRAWINGS

The numerous advantages of the embodiments of the inventive concepts disclosed herein may be better understood by those skilled in the art by reference to the accompanying figures in which:

FIG. 1B shows an environmental view of an exemplary embodiment of a benchtop visual prototyping and assembly system, in accordance with one or more embodiments of the present disclosure;

DETAILED DESCRIPTION

Figure 1A:
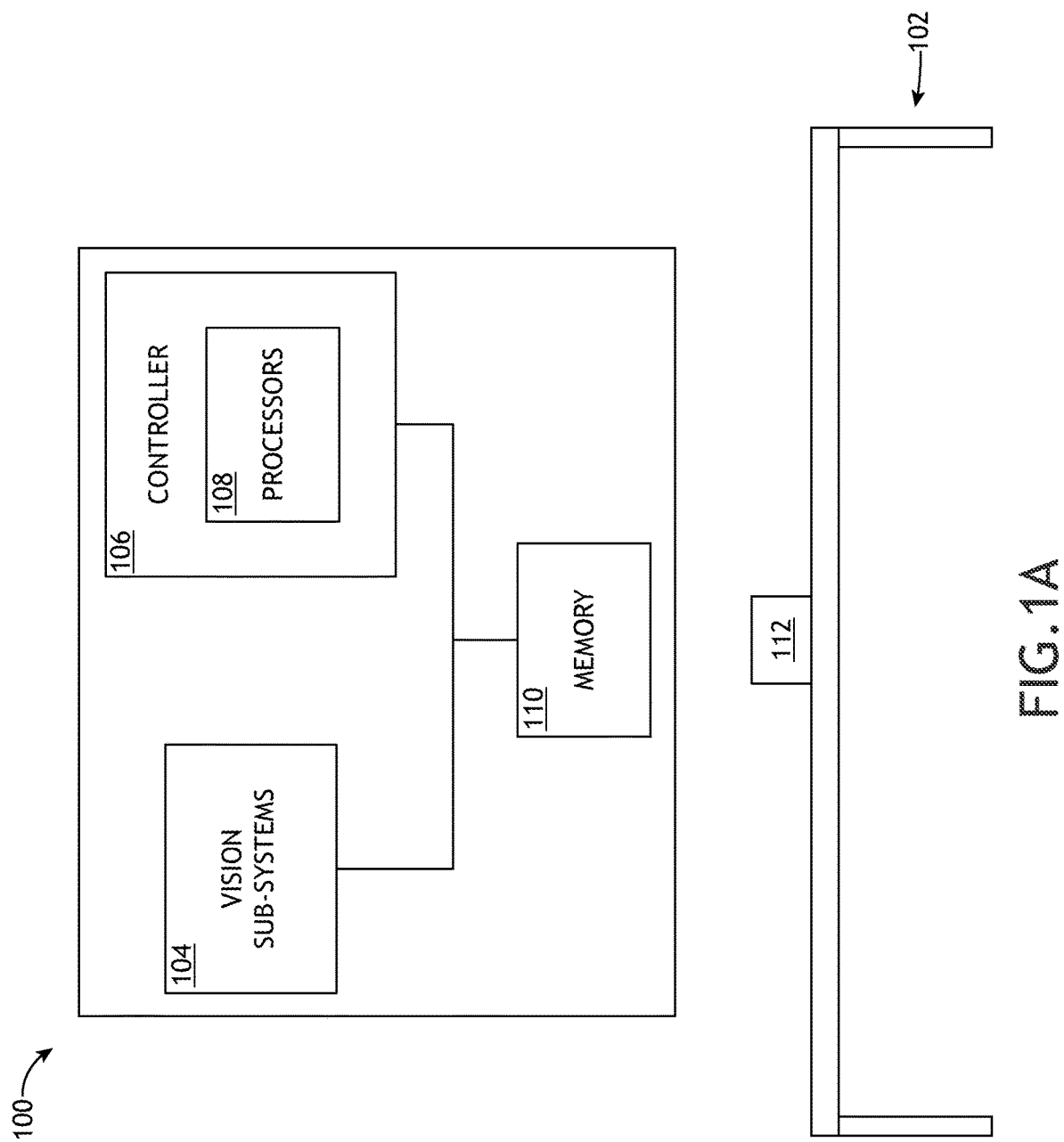
FIG. 1A shows a block diagram of an exemplary embodiment of a benchtop visual prototyping and assembly system, in accordance with one or more embodiments of the present disclosure.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following:

A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disposed herein are directed to a benchtop visual prototyping and assembly system, in accordance with one or more embodiments of the present disclosure.

Referring to FIG. 1A, a conceptual block diagram of an exemplary embodiment of a system 100 for benchtop visual prototyping and assembly is shown, in accordance with one or more embodiments of the present disclosure. The system 100 may be configured for use in the maintenance and assembly of one or more work-in-progress units 112 (shown in FIG. 1B) on a work surface 102 configured to hold the one or more work-in-progress units 112 during maintenance and assembly.

The work surface 102 may include any workstation, workbench, table, platform, workspace, or other implement configured to and/or suitable for holding work-in-progress units 112 during maintenance and/or assembly operations.

The system 100 may include one or more vision sub-systems 104 configured to capture one or more images of the one or more work-in-progress units 112. The one or more vision sub-systems 104 may include any vision system known in the art to be suitable for capturing images and/or signals indicative of one or more aspects of the one or more work-in-progress units 112, including, without limitation, cameras, sensors (e.g., hyperspectral, radar, lidar, or the like), or computer vision systems.

The one or more work-in-progress units 112 may include any aircraft component requiring assembly and/or maintenance from time to time, including, without limitation, one or more avionics systems, displays, inputs, gauges, or the like. For purposes of the present disclosure, the term "work-in-progress unit" may refer to any aircraft component at any stage of maintenance and/or assembly. For example, the term "work-in-progress unit" may refer to an aircraft component prior to the commencement of the maintenance and/or assembly operations (e.g., a collection of elements that, upon completion of a maintenance or assembly operation, comprise an aircraft component). By way of another example, the term "work-in-progress unit" may refer to an aircraft component during the maintenance and/or assembly operations (e.g., a collection of elements that partially maintained and/or assembled). By way of another example, the term "work-in-progress unit" may refer to an aircraft component after completion of the maintenance and/or assembly operations. It is noted that, throughout the present disclosure, the term "WIP" may refer to the one or more work-in-progress units 112.

The system 100 may include one or more controllers 106 having one or more processors 108. the one or more processors 108 may include any one or more processing elements known in the art. In this regard, the one or more processors 108 may include any microprocessor-type device configured to execute software algorithms and/or instructions. In one embodiment, the one or more processors 108 may consist of a desktop computer, mainframe computer system, workstation, image computer, parallel processor, or other computer system (e.g., networked computer) configured to execute a program configured to operate the system 100, as described throughout the present disclosure.

The system 100 may include one or more memory units 110. The one or more memory units 110 may include any storage medium known in the art suitable for storing program instructions executable by the associated one or more processors 108.

The one or more processors 108 of the one or more controllers 106 may be configured to execute one or more sets of program instructions stored in the one or more memory units 110. For example, the one or more sets of program instructions may be configured to cause the controllers 106 (e.g., via the processors 108) to carry out all or some of the steps of the present disclosure.

In one embodiment, the one or more processors 108 may be configured to cause the one or more controllers 106 to receive one or more images of the one or more work-in-progress units 112. For example, the one or more processors 108 may be configured to receive one or more images of the one or more work-in-progress units 112 from the one or more vision sub-systems 104.

In another embodiment, the one or more processors 108 may be configured to determine a current assembly state of the one or more work-in-progress units 112 based on the one or more images of the one or more work-in-progress units 112. For example, the one or more processors 108 may be configured to analyze and/or parse the one or more images of the one or more work-in-progress units 112 to determine an identity and assembly state of the one or more work-in-progress units 112 held by the work surface 102. As used herein, the term "assembly state" may refer to any aspect regarding the position, orientation, assembly, or maintenance of a work-in-progress unit 112. For example, "assembly state" may refer to the position and angular orientation of a work-in-progress unit prior to, during, or following a movement of the work-in-progress unit by an operator. By way of another example, "assembly state" may refer to a current state of the work-in-progress unit with respect to assembly (e.g., a point in the assembly operation).

In another embodiment, the one or more processors 108 may be configured to generate a current digital twin model of the one or more work-in-progress units 112 corresponding to the determined current assembly state. For example, the one or more processors 108 may employ image-based and/or computer vision algorithms to generate a current digital twin (e.g., a virtual model, animation, and/or representation) of the work-in-progress units 112 in their current assembly state. In this sense, the current digital twin may comprise a virtual representation of the work-in-progress units 112 as they exist in the real-world setting (e.g., on the work surface). The one or more processors 108 may be configured to display the current digital twin on one or more user interfaces 114 of the system 100. In this sense, an operator/ user of the system 100 may view the current digital twin on the one or more user interfaces 114.

In another embodiment, the one or more processors 108 may be configured to determine a subsequent assembly state of the one or more work-in-progress units 112. For example, the one or more processors 108 may be configured to receive one or more subsequent images of the one or more work-in-progress units 112 from the one or more vision sub-systems 104. Based on the one or more subsequent images of the one or more work-in-progress units 112, the one or more processors 108 may be configured to analyze and/or parse the one or more subsequent images of the one or more work-in-progress units 112 to determine an identity and subsequent assembly state of the one or more work-in-progress units 112 held by the work surface 102. As used herein, the term "subsequent assembly state" may refer to any aspect regarding the position, orientation, assembly, or maintenance of a work-in-progress unit 112 that exists following at least a prior assembly state. For example, "subsequent assembly state" may refer to the position and angular orientation of a work-in-progress unit during or following a movement of the work-in-progress unit by an operator. By way of another example, "subsequent assembly state" may refer to a current state of the work-in-progress unit with respect to assembly (e.g., a point in the assembly operation).

In another embodiment, the one or more processors 108 may be configured to generate a subsequent digital twin model of the one or more work-in-progress units 112 corresponding to the subsequent assembly state. For example, the one or more processors 108 may employ image-based and/or computer vision algorithms to generate a subsequent digital twin (e.g., a virtual model, animation, and/or representation) of the work-in-progress units 112 in their subsequent assembly state. In this sense, the subsequent digital twin may comprise a virtual representation of the work-in-progress units 112 as they exist in the real-world setting (e.g., on the work surface). The one or more processors 108 may be configured to display the subsequent digital twin on the one or more user interfaces 114 of the system 100. In this sense, an operator/user of the system 100 may view the subsequent digital twin on the one or more user interfaces 114.

Figure 2:
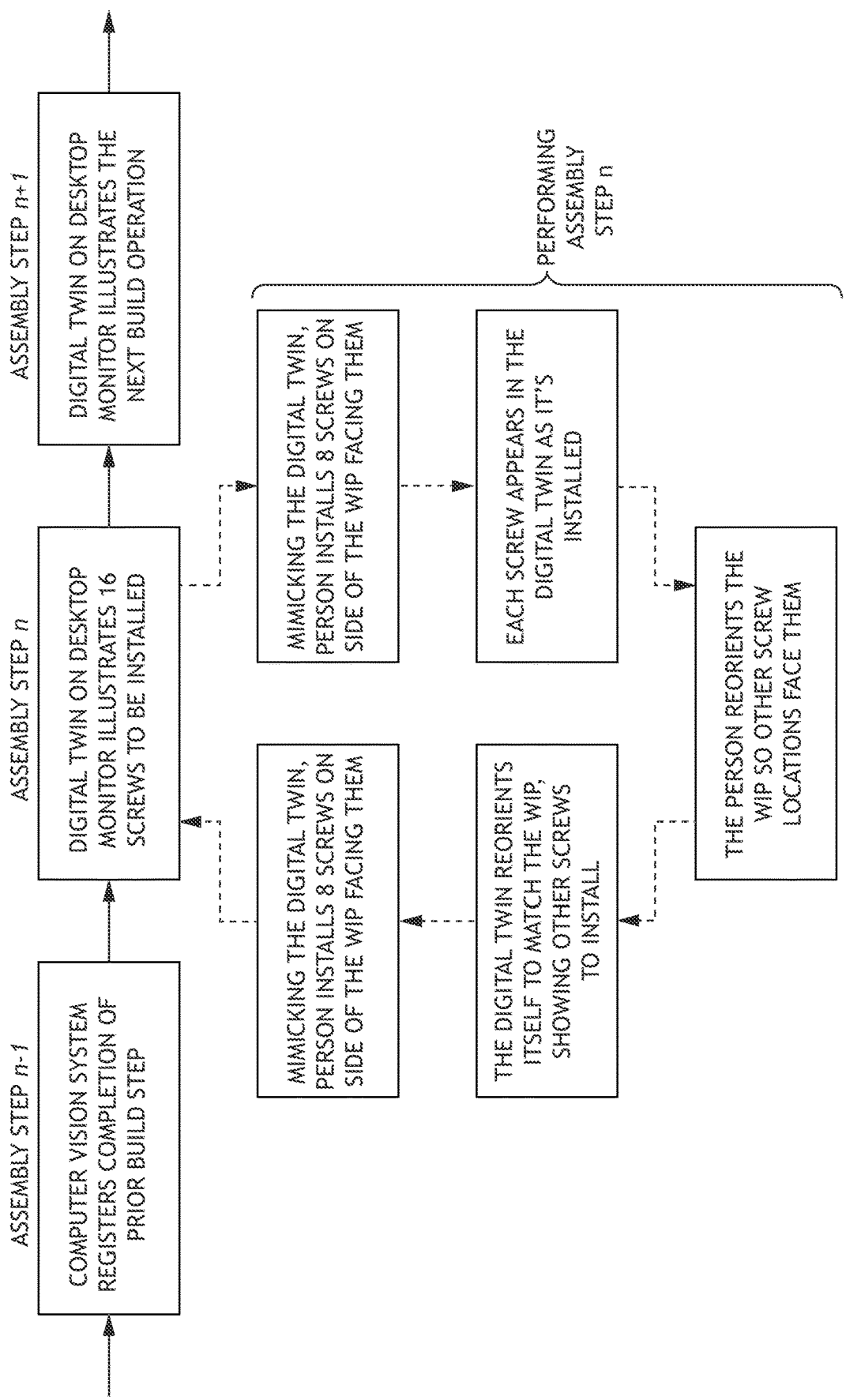
FIG. 2 shows a process flow diagram of an assembly operation, in accordance with one or more embodiments of the present disclosure.

As described herein with reference to FIG. 2, it is noted that the subsequent assembly state and the subsequent digital twin may comprise an assembly state and a digital twin corresponding to the one or more work-in-progress units 112 upon completion of a subsequent assembly step. In another embodiment, the subsequent assembly state and the subsequent digital twin may comprise an assembly state and a digital twin corresponding to the operation of a subsequent assembly step (e.g., the subsequent assembly state may comprise the installation of several screws, and the subsequent digital twin may correspond to the work-in-progress unit 112 during such installation).

The one or more memory units 110 may include any memory unit known in the art to be suitable for the purposes contemplated herein. For example, the one or more memory units 110 may include any memory units suitable for storing one or more images from the vision sub-systems 104. By way of another example, the one or more memory units 110 may include a non-transitory memory medium. For instance, the memory 110 may include, but is not limited to, a read-only memory, a random-access memory, a magnetic or optical memory device (e.g., disk), a magnetic tape, a solid-state drive and the like. The one or more memory units 110 may include remote memory (e.g., server or cloud-based memory), accessible through a network (e.g., internet, intranet and the like). In another embodiment, the memory 110 maintains program instructions for causing the one or more processors 110 to carry out the various steps described through the present disclosure.

The one or more user interfaces 114 may include, but are not limited to, one or more desktops, tablets, smartphones, smart watches, or the like. The user interface 114 includes a display used to display data of the system 100 to a user. For example, the user interface 114 may be configured to display the current digital twin model, the subsequent digital twin model, and/or one or more images received from the one or more vision sub-systems 104. The display of the user interface 114 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 114 is suitable for implementation in embodiments of the present disclosure. In another embodiment, a user may input selections and/or instructions responsive to data displayed to the user via the user interface 114. In this regard, the user interface 114 may be configured to receive input selections and/or instructions from a user through a configuration/calibration app, wherein the input selections may alter one or more characteristics of system 100. Input instructions may include, but are not limited to, calibration and sensitivity instructions for the one or more components of the system (e.g., the one or more vision-subsystems 104).

The one or more components of the system 100 (e.g., the one or more vision sub-systems 104, the one or more controllers 106, the one or more processors 108, the one or more memory units 110, and/or the one or more user interfaces 114) may be communicatively coupled to the various other components of present disclosure in any manner known in the art. For example, the components may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

It should be recognized that the steps described throughout the present disclosure may be carried out by a single computer system or, alternatively, multiple computer systems. In general, the term "processor" may be broadly defined to encompass any device having one or more processing elements, which execute program instructions from memory 110. Moreover, different subsystems of the system 100 (e.g., the one or more vision sub-systems 104, the one or more controllers 106, the one or more processors 108, the one or more memory units 110, and/or the one or more user interfaces 114) may include processor or logic elements suitable for carrying out at least a portion of the steps described throughout the present disclosure. Therefore, the above description should not be interpreted as a limitation on the present disclosure but merely an illustration.

FIG. 1B shows an environmental view of an exemplary embodiment of a benchtop visual prototyping and assembly system, in accordance with one or more embodiments of the present disclosure. The system 100 (or at least a portion of the system 100) may be disposed within an environment having a work surface 102. For example, the system 100 may be disposed within an aircraft assembly or maintenance facility (e.g., hangars, production facilities, bases, airports, aircraft carriers, or the like). The work surface 102 may be configured such that an operator 116 may be able to easily manipulate and work with one or more work-in-progress units 112 on the work surface 102.

In some embodiments, the one or more vision sub-systems 104 may be disposed in an area above or near the work surface 102 such that the one or more vision sub-systems 104 may be able to capture one or more images or receive one or more signals from the one or more work-in-progress units 112 on the work surface 102. For example, the one or more vision sub-systems 104 may be mounted to one or more walls, ceilings, or other fixtures within the environment. By way of another example, the one or more vision sub-systems 104 may be mounted to the work surface 102. It is noted that the one or more vision sub-systems 104 may include any vision system known in the art to be suitable for capturing images and/or signals indicative of one or more aspects of the one or more work-in-progress units 112, including, without limitation, cameras, sensors (e.g., hyperspectral, radar, lidar, or the like), or computer vision systems. In this regard, the position, configuration, and/or orientation of the one or more vision sub-systems 104 may be such that the ability of the one or more vision sub-systems 104 to capture images and/or signals indicative of one or more aspects of the one or more work-in-progress units 112 is maximized.

The one or more user interfaces 114 may be disposed similarly in an area above or near the work surface 102 such that the user 116 may be able to easily view and interact with the display of the one or more user interfaces 114. For example, the one or more user interfaces 114 may be mounted to one or more walls, ceilings, or other fixtures within the environment. In some embodiments, the one or more user interfaces 114 may be configured for handheld use and/or viewing by the user 116. By way of another example, the one or more user interfaces 114 may be mounted to the work surface 102. It is noted that the one or more user interface 114 may include any user interface and/or display known in the art to be suitable for displaying the current digital twin, the subsequent digital twin, and/or one or more images of the one or more work-in-progress units 112, and, in some embodiments, for allowing one or more user inputs to the system 100. In this regard, the position, configuration, and/or orientation of the one or more user interfaces 114 may be such that the ability of the user to view the display and/or interact with (e.g., provide one or more inputs to) the one or more user interfaces 114 is maximized.

FIG. 2 shows a process flow diagram of an exemplary assembly operation, in accordance with one or more embodiments of the present disclosure. The exemplary assembly operation of FIG. 2 refers to the assembly of a component comprising the installation of several screws. The process flow diagram of FIG. 2 refers to each assembly step relative to current assembly step n. For example, the assembly step preceding assembly step n is referred to as assembly step n−1. By way of another example, the assembly step performed after assembly step n is referred to as assembly step n+1.

As previously described, the one or more processors 108 may be configured to determine a current assembly state of the one or more work-in-progress units 112 based on the one or more images of the one or more work-in-progress units 112. For example, as shown in FIG. 2, the one or more vision sub-systems 104 (e.g., computer vision systems) may be configured to capture one or more images and/or signals indicative of a current assembly state of the one or more work-in-progress units 112. In the exemplary embodiment illustrated by the process flow diagram of FIG. 2, the current assembly state of the one or more work-in-progress units 112 comprises the assembly state following completion of a prior build (e.g., assembly) step, such as assembly step n−1.

Upon determination of the current assembly state, the one or more processors 108 may be configured to determine a subsequent assembly state of the one or more work-in-progress units 112. For example, the one or more processors 108 may determine a next assembly step n by reference to one or more known assembly steps stored in memory 110. The one or more subsequent digital twins may be displayed to the user 116 via the user interface 114.

During assembly step n, the one or more processors 108 may be configured to carry out the steps of the present disclosure in a plurality of successive iterations. For example, as between assembly step n−1 and assembly step n, assembly step n−1 may comprise the current assembly step and assembly step n may comprise the subsequent assembly step. However, assembly steps may include a plurality of assembly sub-steps. For example, as shown in FIG. 2, assembly step n may include sub-steps related to the installation of screws and reorientation of the one or more work-in-progress units 112. In this sense, during the execution by a user of assembly step n, the system 100 may determine several current assembly states and generate several current digital twins. Likewise, during the execution by a user of assembly step n, the system 100 may determine several subsequent assembly states and generate several subsequent digital twins relative to the several current assembly states and several current digital twins.

For example, during the execution of assembly step n, a user, mimicking the current digital twin displayed on the one or more user interfaces 114, may install several screws on a side of the work-in-progress unit 112. Upon completion of the installation of each screw, the system 100 may determine a subsequent assembly state and generate a subsequent digital twin showing the completion of the installation of each screw. By way of another example, during the execution of assembly step n, the user may reorient the one or more work-in-progress units 112. The system 100 may be configured to determine a subsequent assembly state and generate a subsequent digital twin following the reorientation of the one or more work-in-progress units 112.

Figure 3:
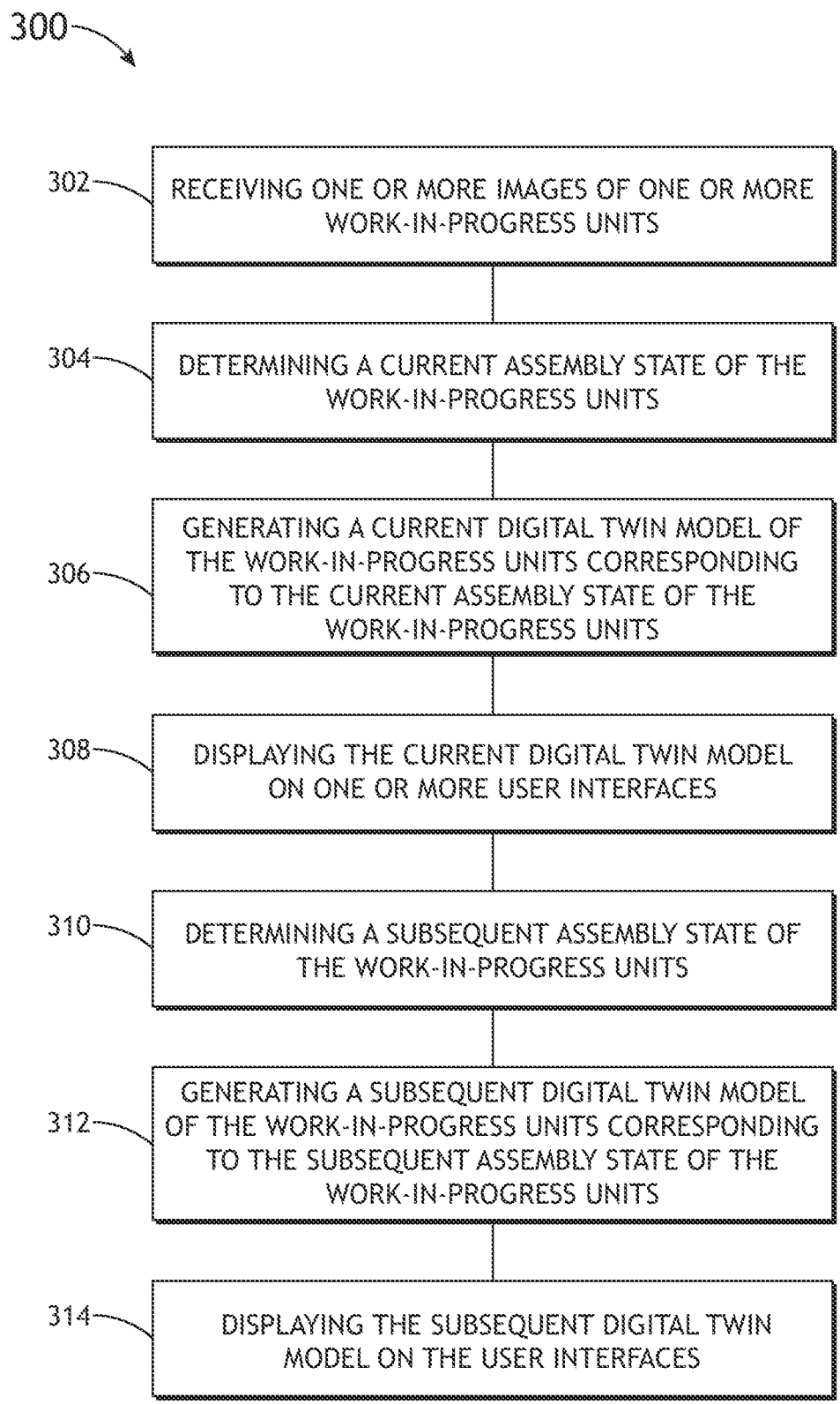
FIG. 3 shows a process flow diagram of an assembly operation, in accordance with one or more embodiments of the present disclosure.

FIG. 3 shows a process flow diagram of an assembly method 300, in accordance with one or more embodiments of the present disclosure.

In Step 302, one or more images of one or more work-in-progress units 300 are received. For example, the one or more processors 108 may be configured to cause the one or more controllers 106 to receive one or more images of the one or more work-in-progress units 112. By way of another example, one or more processors 108 may be configured to receive one or more images of the one or more work-in-progress units 112 from the one or more vision sub-systems 104.

In Step 304, a current assembly state of the one or more work-in-progress units 112 is determined. For example, the current assembly state of the one or more work-in-progress units 112 may be determined by the one or more processors 108 based on the one or more images of the one or more work-in-progress units 112. By way of another example, the one or more processors 108 may be configured to analyze and/or parse the one or more images of the one or more work-in-progress units 112 to determine an identity and assembly state of the one or more work-in-progress units 112 held by the work surface 102. As used herein, the term "assembly state" may refer to any aspect regarding the position, orientation, assembly, or maintenance of a work-in-progress unit 112. For example, "assembly state" may refer to the position and angular orientation of a work-in-progress unit prior to, during, or following a movement of the work-in-progress unit by an operator. By way of another example, "assembly state" may refer to a current state of the work-in-progress unit with respect to assembly (e.g., a point in the assembly operation).

In Step 306, a current digital twin model of the one or more work-in-progress units 112 is generated corresponding to the current assembly state of the one or more work-in-progress units 112. For example, the one or more processors 108 may be configured to generate a current digital twin model of the one or more work-in-progress units 112 corresponding to the determined current assembly state. By way of another example, the one or more processors 108 may employ image-based and/or computer vision algorithms to generate a current digital twin (e.g., a virtual model, animation, and/or representation) of the work-in-progress units 112 in their current assembly state. In this sense, the current digital twin may comprise a virtual representation of the work-in-progress units 112 as they exist in the real-world setting (e.g., on the work surface).

In Step 308, the current digital twin model is displayed on one or more user interfaces 114. For example, the one or more processors 108 may be configured to display the current digital twin on the one or more user interfaces 114 of the system 100. In this sense, an operator/user of the system 100 may view the current digital twin on the one or more user interfaces 114.

In Step 310, a subsequent assembly state of the one or more work-in-progress units 112 is determined. For example, the one or more processors 108 may be configured to determine a subsequent assembly state of the one or more work-in-progress units 112. By way of another example, the one or more processors 108 may be configured to receive one or more subsequent images of the one or more work-in-progress units 112 from the one or more vision sub-systems 104. Based on the one or more subsequent images of the one or more work-in-progress units 112, the one or more processors 108 may be configured to analyze and/or parse the one or more subsequent images of the one or more work-in-progress units 112 to determine an identity and subsequent assembly state of the one or more work-in-progress units 112 held by the work surface 102. As used herein, the term "subsequent assembly state" may refer to any aspect regarding the position, orientation, assembly, or maintenance of a work-in-progress unit 112 that exists following at least a prior assembly state. For example, "subsequent assembly state" may refer to the position and angular orientation of a work-in-progress unit during or following a movement of the work-in-progress unit by an operator. By way of another example, "subsequent assembly state" may refer to a current state of the work-in-progress unit with respect to assembly (e.g., a point in the assembly operation).

In some embodiments, as described herein with reference to FIG. 2, it is noted that the subsequent assembly state and the subsequent digital twin may comprise an assembly state and a digital twin corresponding to the one or more work-in-progress units 112 upon completion of a subsequent assembly step. In another embodiment, the subsequent assembly state and the subsequent digital twin may comprise an assembly state and a digital twin corresponding to the operation of a subsequent assembly step (e.g., the subsequent assembly state may comprise the installation of several screws, and the subsequent digital twin may correspond to the work-in-progress unit 112 during such installation).

In Step 312, a subsequent digital twin model of the one or more work-in-progress units 112 is generated corresponding to the subsequent assembly state of the one or more work-in-progress units 112. For example, the one or more processors 108 may be configured to generate a subsequent digital twin model of the one or more work-in-progress units 112 corresponding to the subsequent assembly state. By way of another example, the one or more processors 108 may employ image-based and/or computer vision algorithms to generate a subsequent digital twin (e.g., a virtual model, animation, and/or representation) of the work-in-progress units 112 in their subsequent assembly state. In this sense, the subsequent digital twin may comprise a virtual representation of the work-in-progress units 112 as they exist in the real-world setting (e.g., on the work surface).

In Step 314, the subsequent digital twin model is displayed on the one or more user interfaces 114. For example, the one or more processors 108 may be configured to display the subsequent digital twin on the one or more user interfaces 114 of the system 100. In this sense, an operator/user of the system 100 may view the subsequent digital twin on the one or more user interfaces 114.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages. The form herein before described being merely an explanatory embodiment thereof, it is the intention of the following claims to encompass and include such changes.

What is claimed is:

1. A visual prototyping and assembly system, comprising:
   a work surface configured to hold one or more work-in-progress units during an assembly operation;
   one or more vision sub-systems configured to capture one or more images of the one or more work-in-progress units; and
   one or more controllers comprising one or more processors, wherein the one or more processors are configured to execute a set of program instructions stored in one or more memory units communicatively coupled to the one or more processors, wherein the set of program instructions is configured to cause the one or more controllers to:
   receive the one or more images of the one or more work-in-progress units;
   determine a current assembly state of the one or more work-in-progress units based on the one or more images of the one or more work-in-progress units; wherein determining the current assembly state of the one or more work-in-progress units comprises at least determining a current orientation of the one or more work-in-progress units on the work surface;
   generate a current digital twin model of the one or more work-in-progress units corresponding to the current assembly state of the one or more work-in-progress units and display the current digital twin model on one or more user interfaces; wherein displaying the current digital twin model of the one or more work-in-progress units on one or more user interfaces comprises displaying the current digital twin model in a current model orientation, wherein the current model orientation corresponds to the current orientation;

determine a subsequent assembly state of the one or more work-in-progress units based on the current assembly state and assembly steps of the one or more work-in-progress units maintained in the one or memory units; wherein the subsequent assembly state of the one or more work-in-progress units comprises an assembly state of the one or more work-in-progress units following the completion of one or more of the assembly steps; wherein determining the subsequent assembly state of the one or more work-in-progress units comprises determining a subsequent orientation of the one or more work-in-progress units on the work surface; and generate a subsequent digital twin model of the one or more work-in-progress units corresponding to the subsequent assembly state of the one or more work-in-progress units and display the subsequent digital twin model on the one or more user interfaces; wherein displaying the subsequent digital twin model of the one or more work-in-progress units on the one or more user interfaces comprises displaying the subsequent digital twin model in a subsequent model orientation, wherein the subsequent model orientation corresponds to the subsequent orientation; wherein the subsequent digital twin model is displayed during execution of the one or more of the assembly steps.

2. The system of claim 1, wherein the current assembly state of the one or more work-in-progress units comprises an assembly state of the one or more work-in-progress units at the outset or during the performance of the assembly operation, wherein the assembly operation comprises one or more assembly steps.

3. The system of claim 2, wherein the subsequent assembly state of the one or more work-in-progress units comprises an assembly state of the one or more work-in-progress units following the completion of one or more assembly steps.

4. The system of claim 1, wherein the one or more vision sub-systems comprise one or more computer vision systems.

5. A method of visually modeling an assembly operation, comprising:

receiving one or more images of one or more work-in-progress units;

determining a current assembly state of the one or more work-in-progress units based on the one or more images of the one or more work-in-progress units; wherein determining the current assembly state of the one or more work-in-progress units comprises at least determining a current orientation of the one or more work-in-progress units;

generating a current digital twin model of the one or more work-in-progress units corresponding to the current assembly state of the one or more work-in-progress units and displaying the current digital twin model on one or more user interfaces; wherein displaying the current digital twin model of the one or more work-in-progress units on one or more user interfaces comprises displaying the current digital twin model in a current model orientation, wherein the current model orientation corresponds to the current orientation;

determining a subsequent assembly state of the one or more work-in-progress units based on the current assembly state and assembly steps of the one or more work-in-progress units; wherein the subsequent assembly state of the one or more work-in-progress units comprises an assembly state of the one or more work-in-progress units following the completion of one or more of the assembly steps; wherein determining a subsequent assembly state of the one or more work-in-progress units comprises at least determining a subsequent orientation of the one or more work-in-progress units; and generating a subsequent digital twin model of the one or more work-in-progress units corresponding to the subsequent assembly state of the one or more work-in-progress units and displaying the subsequent digital twin model on the one or more user interfaces; wherein displaying the subsequent digital twin model of the one or more work-in-progress units on the one or more user interfaces comprises displaying the subsequent digital twin model in a subsequent model orientation, wherein the subsequent model orientation corresponds to the subsequent orientation; wherein the subsequent digital twin model is displayed during execution of the one or more of the assembly steps.

6. The method of claim 5, wherein the current assembly state of the one or more work-in-progress units comprises an assembly state of the one or more work-in-progress units at the outset or during the performance of the assembly operation, wherein the assembly operation comprises one or more assembly steps.

7. The method of claim 6, wherein the subsequent assembly state of the one or more work-in-progress units comprises an assembly state of the one or more work-in-progress units following the completion of one or more assembly steps.

* * * * *